(12) United States Patent
Bhargava et al.

(10) Patent No.: US 10,050,606 B2
(45) Date of Patent: Aug. 14, 2018

(54) DECIMATION FIR FILTERS AND METHODS

(71) Applicant: STMicroelectronics International N.V., Schiphol (NL)

(72) Inventors: Neha Bhargava, Greater Noida (IN); Ankur Bal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 15/632,202

(22) Filed: Jun. 23, 2017

(65) Prior Publication Data

US 2017/0294898 A1     Oct. 12, 2017

Related U.S. Application Data

(63) Continuation-in-part of application No. 14/573,055, filed on Dec. 17, 2014.

(51) Int. Cl.
    *H03H 17/02*       (2006.01)
    *H03H 21/00*       (2006.01)

(52) U.S. Cl.
    CPC .... *H03H 17/0283* (2013.01); *H03H 21/0027* (2013.01)

(58) Field of Classification Search
    CPC .................................................. H03H 17/0671
    See application file for complete search history.

(56) References Cited

U.S. PATENT DOCUMENTS

| | | | |
|---|---|---|---|
| 4,924,223 A | 5/1990 | Okamoto | |
| 5,810,908 A | 9/1998 | Gray et al. | |
| 5,910,908 A * | 6/1999 | Slavin | H03H 17/0664 708/313 |
| 6,041,339 A | 3/2000 | Yu et al. | |
| 6,260,053 B1 | 7/2001 | Maulik et al. | |
| 6,871,207 B1 * | 3/2005 | Nanda | H03H 17/0671 708/313 |
| 8,271,567 B2 * | 9/2012 | Nene | H03H 17/0227 708/203 |

(Continued)

OTHER PUBLICATIONS

Eugene Hogenauer, An Economical Class of Digital Filters for Decimation and Interpolation, IEEE Transactions on Acoustics Speeck and Signal Processing, vol. ASSP-29, No. 2, May 1981.*

(Continued)

*Primary Examiner* — Aimee J Li
*Assistant Examiner* — Emily E Larocque
(74) *Attorney, Agent, or Firm* — Slater Matsil, LLP

(57) ABSTRACT

A polyphase decimation FIR filter apparatus including a modulo integrator circuit configured to integrate input samples and to provide integrated input samples; and a polyphase FIR filter circuit configured to process the integrated input samples, the polyphase FIR filter circuit including a plurality of multiplier accumulator circuits, each configured to accumulate products of coefficients and respective integrated signal samples, wherein each of the multiplier accumulator circuits receives a subset of FIR filter coefficients, wherein the FIR filter coefficients are derived as the nth difference of original filter coefficients, where n is a number of integrators in the integrator circuit, and wherein the FIR filter circuit is configured to perform computation operations with modulo arithmetic.

21 Claims, 11 Drawing Sheets

(56) References Cited

U.S. PATENT DOCUMENTS

2006/0103555 A1* 5/2006 Antonesei .......... H03H 17/0275
 341/61
2013/0110898 A1* 5/2013 Bal .................... H03H 17/0664
 708/316

OTHER PUBLICATIONS

Arzi, J., "Small tutorial on CIC filters", e-mail: contract AT tsdconseil.fr, Dec. 1, 2015, 9 pages.
Donadio, M.P., "CIC Filter Introduction", m.p.donadio@ieee.org., Jul. 18, 2000, 6 pages.
SPIRAL., "Multiplierless Constant Multiplication,", Spiral Software/Hardware Generation for DSP Algorithms, http://http://spiral.net/hardware/multless.html, Retrieved Jul. 22, 2014.
Tummeltshammer, P., et al., "Time-Multiplexed Multiple-Constant Multiplication," IEEE Transactions on Computer-Aided Design of Integrated Circuits and Systems, vol. 26, Issue 9, Sep. 2007, pp. 1551-1563.
Vaidyanathan, P.P., "Multirate Digital Filters, Filter Banks, Polyphase Networks, and Application: A Tutorial," Proceedings of the IEEE, vol. 78, Issue 1, Jan. 1990, pp. 56-93.

* cited by examiner

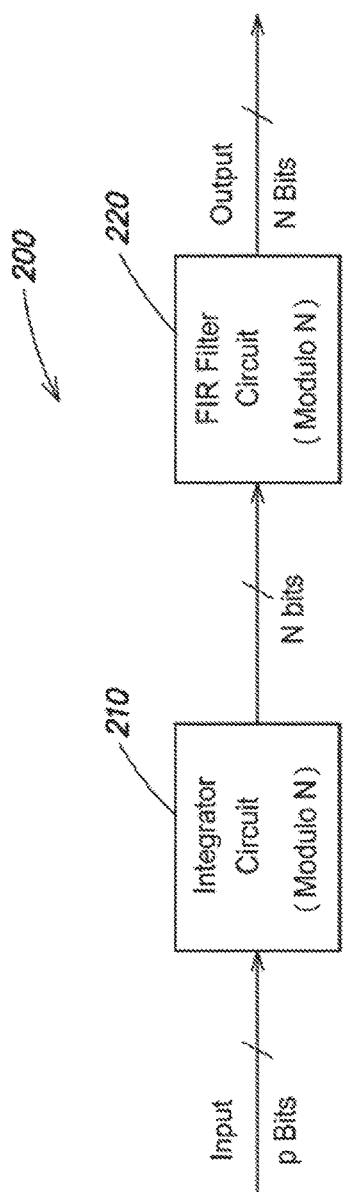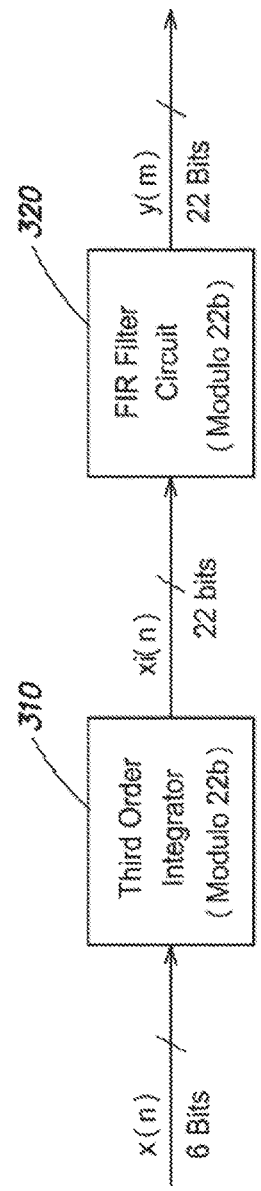
FIG. 2
FIG. 3A

| Design Goals | Conventional Filter | Proposed Filter |
|---|---|---|
| Combinational Area ($um^2$) | 3836 | 2069.3 (-46%) |
| Sequential Area ($um^2$) | 902.3 | 1138.8 (+26%) |
| Overall Area ($um^2$) | 4738.3 | 3208.1 (-32.3%) |
| Total Dynamic Power (mW) | 0.03 | 0.024 (-20%) |
| Critical Path Slack (ns) | +11.83 | +12.58 |

DECIMATION FIR FILTERS AND METHODS

CROSS-REFERENCE TO RELATED APPLICATIONS

This application is a continuation-in-part of U.S. application Ser. No. 14/573,055, filed on Dec. 17, 2014, which application is hereby incorporated herein by reference.

TECHNICAL FIELD

This disclosure relates to polyphase decimation Finite Impulse Response (FIR) filters and to methods for polyphase decimation FIR filtering. More particularly, the disclosure relates to polyphase decimation FIR filters and methods which exhibit low power consumption and small chip area.

BACKGROUND

Multi-rate systems have been used in digital signal processing (DSP) and continue to find applications in new and emerging areas. Small area and low power consumption are important criteria in the design of DSP systems. These criteria necessitate efficient implementation of basic building blocks of multi-rate signal processing, namely decimators and interpolators. FIR filters are usually preferred in multi-rate systems over infinite impulse response (IIR) filters because of their inherent stability, easily-designed linear phase response and computational efficiency. Polyphase decomposition of an FIR filter is a power efficient technique as it allows operation of subfilters at lower data rates and also computation of only useful output samples in the case of decimation.

Multiplication is a major source of power dissipation in FIR filters. Techniques have been proposed to achieve low power multipliers. A differential coefficient technique has been proposed to reduce coefficient precision in single rate FIR filters. Notwithstanding these developments, there is a need for improved decimation FIR filters.

SUMMARY

According to one embodiment, a polyphase decimation FIR filter apparatus comprises an integrator circuit configured to integrate input samples and to provide integrated input samples; and a polyphase FIR filter circuit configured to process the integrated input samples. The integrator circuit has a pole at dc and therefore can experience overflow. The use of two's complement arithmetic resolves this overflow situation by keeping the integrator word width equal to the maximum word width that can appear at the filter output for a given input. If we denote the input bit precision by L and the maximum fixed point gain of the filter by G, then the integrator word width=L+G. Using two's complement binary format in the following filter and the same word width, with the filter transfer function being $H(z) \cdot (1-z^{-1})$, where H (z) is the original filter z-domain transfer function, outputs can be computed correctly.

In embodiments the polyphase FIR filter circuit uses a plurality of independent multiplier accumulator circuits operating concurrently on input samples. Each multiplier accumulator circuit performs multiply and accumulate operations for k input cycles, where k is a decimation factor, using sets of k coefficients. After every k input cycles, the coefficients of the multiplier accumulator circuits are changed, but the multiplier accumulator circuits continue accumulating the results. One of the multiplier accumulator circuits is selected to produce an output value after every k input cycles. Thereafter, that particular multiplier accumulator circuit is reset and starts accumulating results from a next set of samples and a next set of coefficients. The sets of coefficients applied to each of the multiplier accumulator circuits and the multiplier accumulator circuit selected for output change in a cyclic manner every k input cycles.

In some embodiments, a polyphase decimation FIR filter apparatus comprises: a modulo integrator circuit configured to integrate input samples and to provide integrated input samples; and a polyphase FIR filter circuit configured to process the integrated input samples, the polyphase FIR filter circuit comprising: a plurality of multiplier accumulator circuits, each configured to accumulate products of coefficients and respective integrated signal samples, wherein each of the multiplier accumulator circuits receives a subset of FIR filter coefficients, wherein the FIR filter coefficients are derived as the nth difference of original filter coefficients, where n is a number of integrators in the integrator circuit, and wherein the FIR filter circuit is configured to perform computation operations with modulo arithmetic.

BRIEF DESCRIPTION OF THE DRAWINGS

For a better understanding of the embodiments, reference is made to the accompanying drawings, which are incorporated herein by reference and in which:

FIG. 2 is a schematic block diagram of a decimation FIR filter in accordance with embodiments;

FIG. 3A is a schematic block diagram of a decimation FIR filter in accordance with additional embodiments;

FIG. 9 is a table that provides synthesis results of an example FIR filter; and

DETAILED DESCRIPTION OF ILLUSTRATIVE EMBODIMENTS

Figure 1:
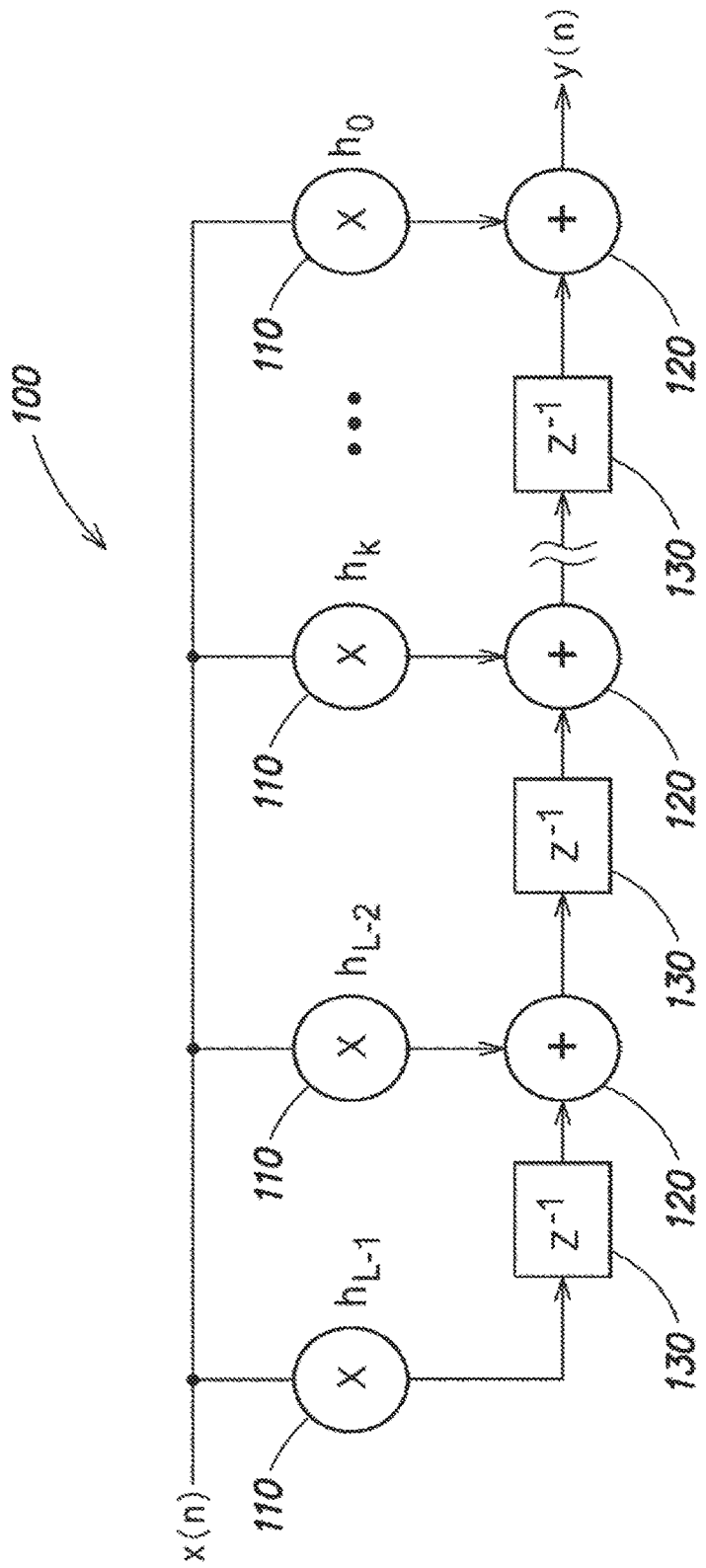
FIG. 1 is a schematic block diagram of a conventional FIR filter.

A block diagram of a conventional FIR filter 100 is shown in FIG. 1. The FIR filter 100 includes multipliers 110, summing units 120 and delay elements 130. The number of multipliers no corresponds to the number of filter taps in the FIR filter 100. Input signal samples x(n) are multiplied by respective filter coefficients $h_k$ in multipliers no and the results, in each stage except the first stage, are summed with the delayed results from the previous stage to provide an output y(n).

The input signal samples x(n) and the coefficients $h_k$ are multi-bit values. The multiplication performed by multipliers no in conventional FIR filters is a major source of power dissipation. Further, the power dissipation increases as the number of filter taps in the FIR filter increases.

Conventional polyphase decimation filters for decimation by k include k subfilters. In the polyphase subfilters, a set of k successive input samples is convolved with sets of k coefficients, each coefficient taken from one of the k subfilters, in calculation of an output. The sets of coefficients are as follows:

First set: h[0], ..., h[k−2], h[k−1]
Second set: h[k], ..., h[2k−2], h[2k−1] and
Third set: h[Mk−k+1], ..., h[Mk−2], h[Mk−1], where k is the decimation factor and M is the number of subfilters.

The partial response to one set of inputs is combined with the response to subsequent sets of inputs until the set of input samples is shifted out of the filter. This fact can be exploited to build a filter structure in which computation can be carried out in independent circuits which are multiplier accumulators. The proposed polyphase decimation FIR filter architecture uses M independent multiplier accumulator circuits operating concurrently on input samples x(n), where M is the number of filter taps T in the filter divided by the decimation factor k.

A schematic block diagram of a decimation FIR filter apparatus in accordance with embodiments is shown in FIG. 2. FIR filter apparatus 200 includes an integrator circuit 210 and a polyphase FIR filter circuit 220 connected in series. The integrator circuit 210 and the polyphase FIR filter circuit 220 may use two's complement and operate in a modulo N configuration (using modulo N arithmetic). As known, when the integrator circuit 210 overflows, it wraps around. For example, when a 3-bit integrator circuit using two's complement and modulo 3 arithmetic has a value of 2, and 1 is added to it, the 3-bit integrator value changes to −3.

The integrator circuit 210 receives an input word of P bits and provides an output of N bits to FIR filter circuit 220. The polyphase FIR filter circuit 220 provides an output of N bits, where N is greater than P. The FIR filter apparatus 200 performs decimation by a decimation factor k. As discussed below, the decimation factor k may be programmable.

The FIR filter apparatus 200 of FIG. 2 takes advantage of a differential coefficient method to minimize the word length of the filter coefficients without compromising the frequency response of the filter, so that the multiply operation consumes less power than in conventional FIR filters. The differential coefficient method exploits the correlation between consecutive coefficients of an FIR filter and uses the difference between the coefficients which can be represented in smaller word lengths than full precision coefficients. The smaller word-length coefficients are used in the multiply operations instead of the full precision coefficients. In other words, the smaller word-length coefficients are not reconstructed into full precision coefficients. In some embodiments, the integrator may be of an $m^{th}$ order while the new filter coefficients with smaller word-length may be derived as the $m^{th}$ order difference of the original coefficient with full precision. The integrator circuit 210 and the FIR filter circuit 220 are discussed in detail below.

An implementation of the FIR filter apparatus 200 is shown in FIG. 3A. The FIR filter apparatus 200 includes a third order integrator circuit 310 and a polyphase FIR filter circuit 320. The third order integrator circuit 310 and the FIR filter circuit 320 operate in a modulo 22 bit configuration. The third order integrator circuit 310 receives input samples x(n) of 6 bits and provides integrated input samples $x_i(n)$ of 22 bits to FIR filter circuit 320. The FIR filter circuit 320 may utilize new filter coefficients which are derived as the third order difference of the original filter coefficients. The FIR filter circuit 320 provides output samples y(m) of 22 bits. The FIR filter circuit 320 also performs decimation by a decimation factor k. Thus, the filter apparatus 200 of FIG. 3A produces one output sample y(m) for every k input samples x(n). By way of example only, the FIR filter circuit 320 may perform decimation by a decimation factor of 24.

Figure 3B:
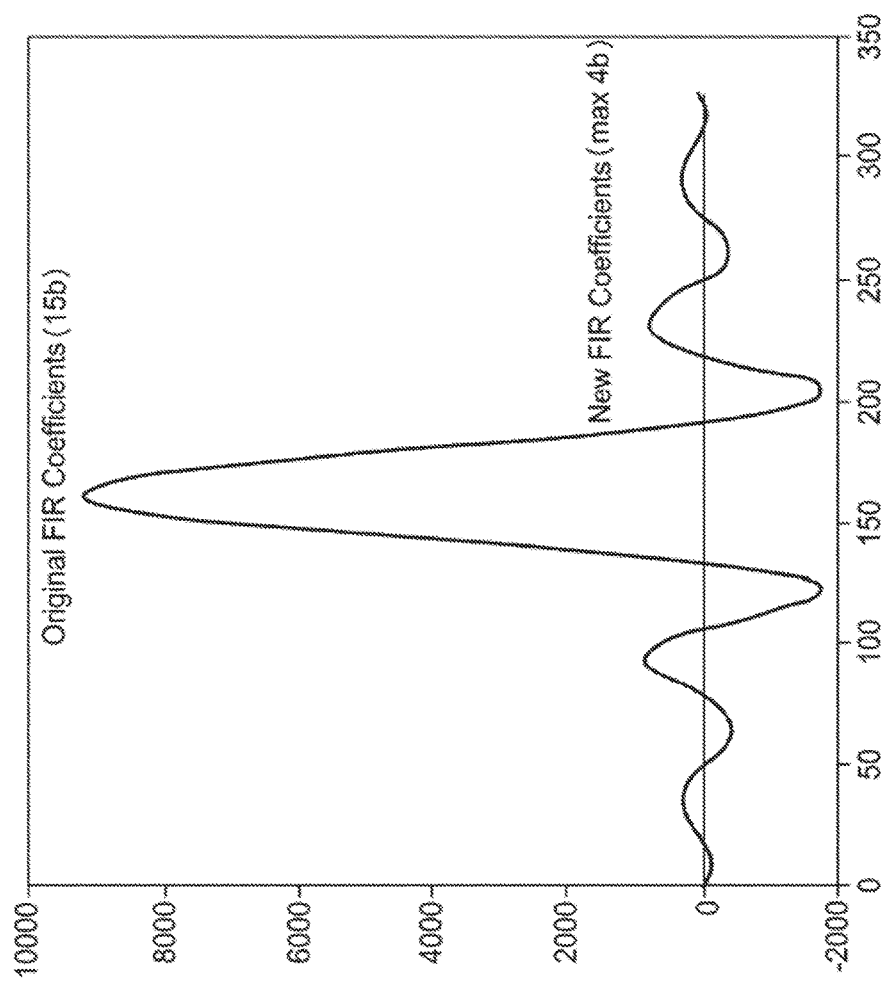
FIG. 3B is a graph of coefficient value as a function of filter tap for an FIR filter having 325 taps and a coefficient size of 15 bits.
Figure 3C:
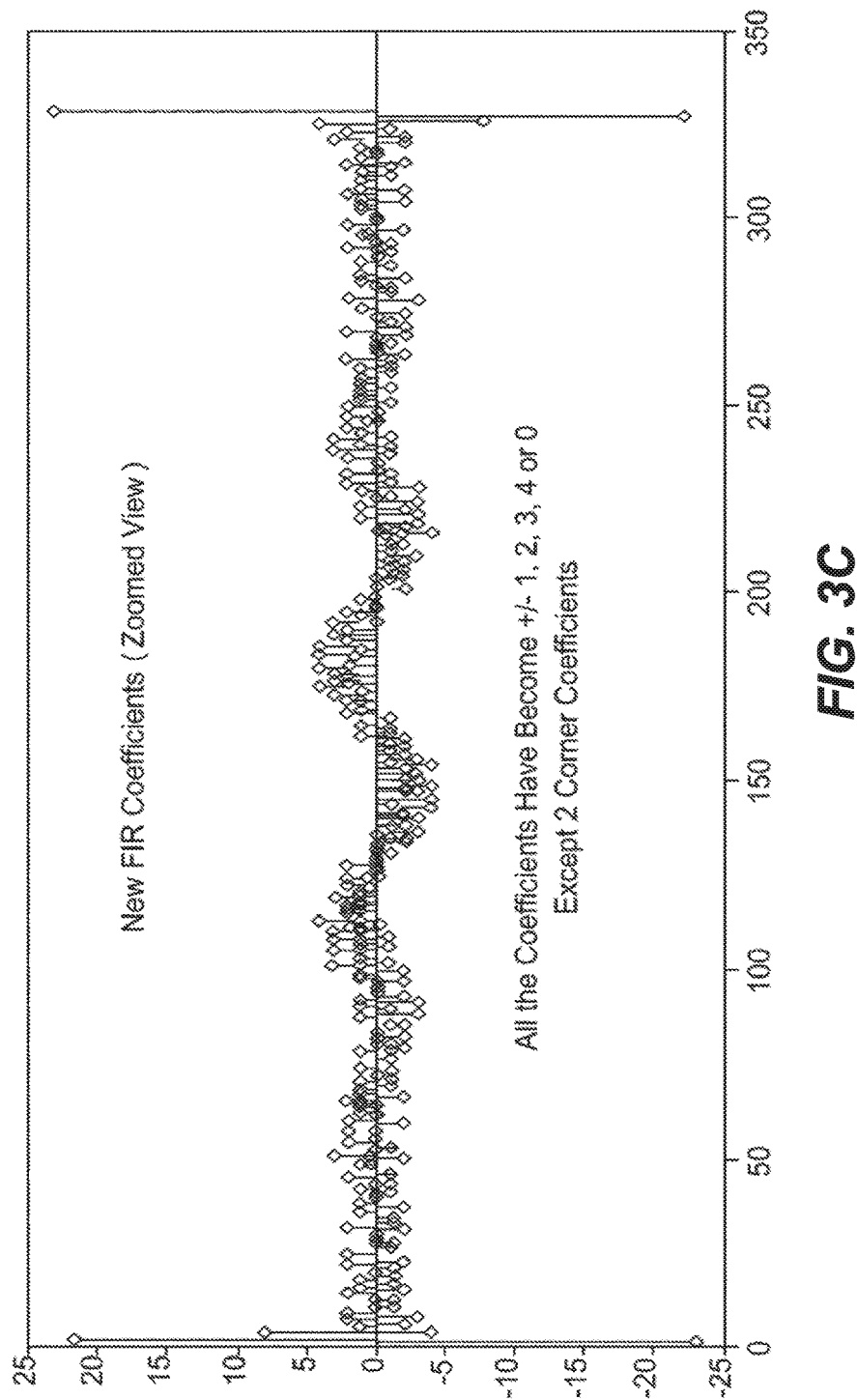
FIG. 3C is a graph of coefficient value as a function of filter tap using the differential coefficient method.

The differential coefficient method is described with reference to FIGS. 3B and 3C. An original FIR coefficient set having a coefficient size of 15 bits for a 325 tap FIR filter having an output precision of 22 bits for an input precision of 6 bits and a decimation factor of 24 is shown in FIG. 3B. As shown, the coefficients have a wide range of values. The new FIR filter coefficients using the differential coefficient method are shown in FIG. 3C. The new FIR filter coefficients of FIG. 3C represent the difference between consecutive coefficients and are represented by a 4 bit word length. In the example shown all the coefficients of the new FIR filter coefficients that have values of +/−1, 2, 3, 4 or 0, except for coefficients at the ends of the FIR filter. The vertical scale of FIG. 3C is expanded relative to the vertical scale of FIG. 3B. By representing the coefficients with a small number of bits, the circuitry of the FIR filter can be simplified substantially.

Figure 4:
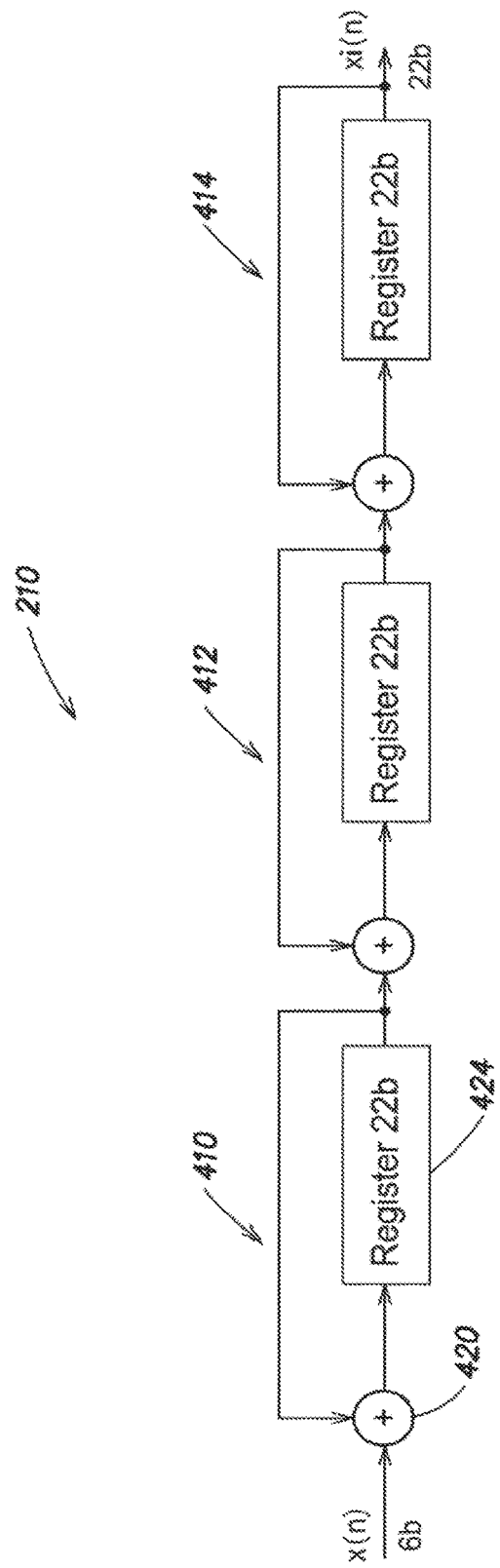
FIG. 4 is a schematic block diagram of the third order integrator of FIG. 3A, in accordance with embodiments.

An implementation of integrator circuit 210 in accordance with embodiments is shown in FIG. 4. The integrator circuit 210 includes a first stage 410, a second stage 412 and a third stage 414 connected in series. As described above, the integrator circuit 210 receives input samples x(n) of 6 bits and provides integrated input samples $x_i(n)$ of 22 bits to FIR filter circuit 220 and operates with modulo 22 arithmetic.

Each of the stages 410, 412 and 414 includes a summing unit 420 and a register 424, which, in the example of FIG. 4, is a 22-bit register. A first input of each summing unit 420 receives input values and a second input of each summing unit 420 receives the output of register 424. The output of the summing unit 420 is provided to register 424, and the output of register 424 is provided to the following stage or to the FIR filter circuit 220.

Figure 5:
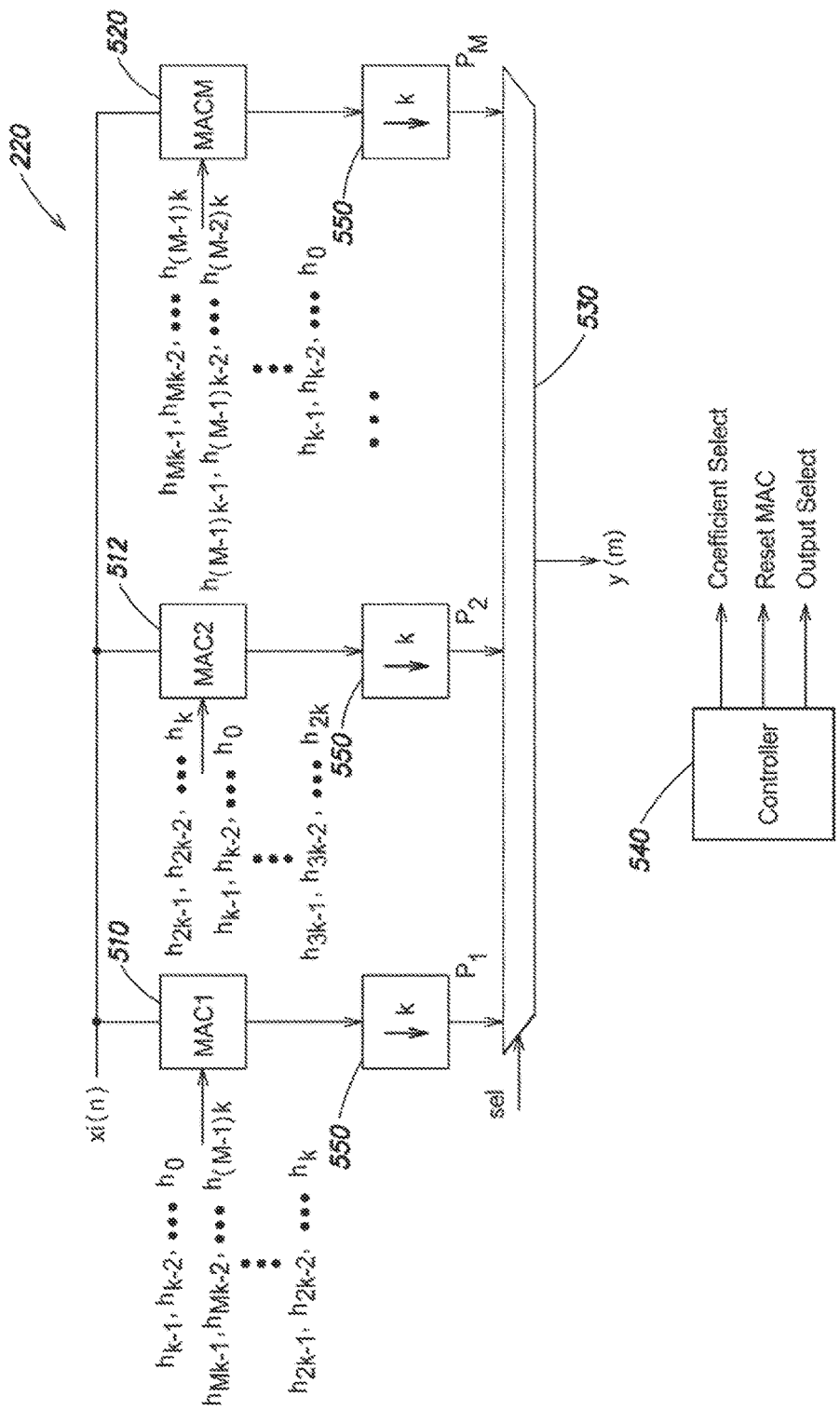
FIG. 5 is a schematic block diagram of a polyphase FIR filter circuit in accordance with embodiments.

A schematic block diagram of FIR filter circuit 220 in accordance with embodiments is shown in FIG. 5. The FIR filter circuit 220 includes a plurality of multiplier accumulator (MAC) circuits 510, 512, ... 520, an output selector 530 and a controller 540. The FIR filter circuit 220 performs decimation by a decimation factor k, such that the output sample rate is reduced by the factor k with respect to the input sample rate. The decimation is indicated in FIG. 5 by decimation blocks 550. However in practice, the decimation may be effected by operation of the MAC circuits 510, 512, ... 520 and the output selector 530, such that no circuitry is associated with decimation blocks 550.

Each of the MAC circuits 510, 512, ... 520 receives integrated input samples $x_i(n)$ from integrator circuit 210 at a first input and receives filter coefficient values derived as a difference of the original coefficient at a second input. The values are multiplied and accumulated as described below. Each of the MAC circuits 510, 512, ... 520 performs multiply and accumulate operations for k input cycles using sets of k coefficients. After every k input cycles, the coefficients of the MAC are changed, but the MAC circuits continue accumulating the results. One of the MAC circuits is selected for producing an output value y(m) after every k input cycles. Thereafter, that MAC circuit is reset and starts accumulating results from a next set of samples and a next set of coefficients. The sets of coefficients applied to each MAC circuit and the MAC circuit selected for output change in a cyclic manner. The selection of coefficients to be applied to each of the MAC circuits and the MAC circuit selected for output are controlled by the controller 540.

The FIR filter circuit 220 may include M MAC circuits, where M is based on the number of filter taps T in a particular FIR filter and the decimation factor k. In particular, the number M of MAC circuits in the FIR filter circuit 220 may be the number of filter taps T divided by the decimation factor k, rounded to the next higher integer if necessary.

As shown in FIG. 5, the filter coefficients h are divided into M sets of coefficients and the sets of coefficients are applied to respective MAC circuits 510, 512, ... 520. In particular, a first set of coefficients $h_{k-1}, h_{k-2}, \ldots h_0$ is applied to MAC circuit 510 during a first period of k input cycles; a second set of coefficients $h_{2k-1}, h_{2k-2}, \ldots h_k$ is applied to MAC circuit 512 during the first period; and a last set of coefficients $h_{Mk-1}, h_{Mk-2}, \ldots h_{(M-1)k}$ is applied to MAC circuit 520 during the first time period. During consecutive time periods of k input cycles, the sets of coefficients are applied to successive MACs in a rotating manner as shown in FIG. 5. Some embodiments may store the filter coefficients in respective memory banks (not shown) associated with respective MAC circuits 510, 512, ... 520. The coefficients of each memory bank may be stored non-consecutively, as disclosed, for example, in U.S. Patent Pub. No. 2013/0110898, which is incorporated herein by reference in its entirety.

During each period of k input cycles, the integrated input samples xi(n) are multiplied in each MAC circuit by the respective coefficient values in a convolution operation. Thus, for example in MAC circuit 510 integrated input sample xi(o) is multiplied by coefficient ho, input sample xi(1) is multiplied by coefficient h1, etc., and the results are accumulated. After each period of k input cycles, the sets of coefficients applied to each MAC circuit are changed, as indicated by the second and following rows of coefficients in FIG. 5, and the MAC circuits continue to accumulate results. Every k input cycles, the output selector 530 selects one of the MAC circuits 510, 512, ... 520 for output, so that output values y(m) are produced at a rate which is reduced by the decimation factor k with respect to the rate of input samples. After a MAC circuit output is selected by output selector 530, that MAC circuit is reset and begins accumulating a new set of input values multiplied by coefficients.

Figure 6:
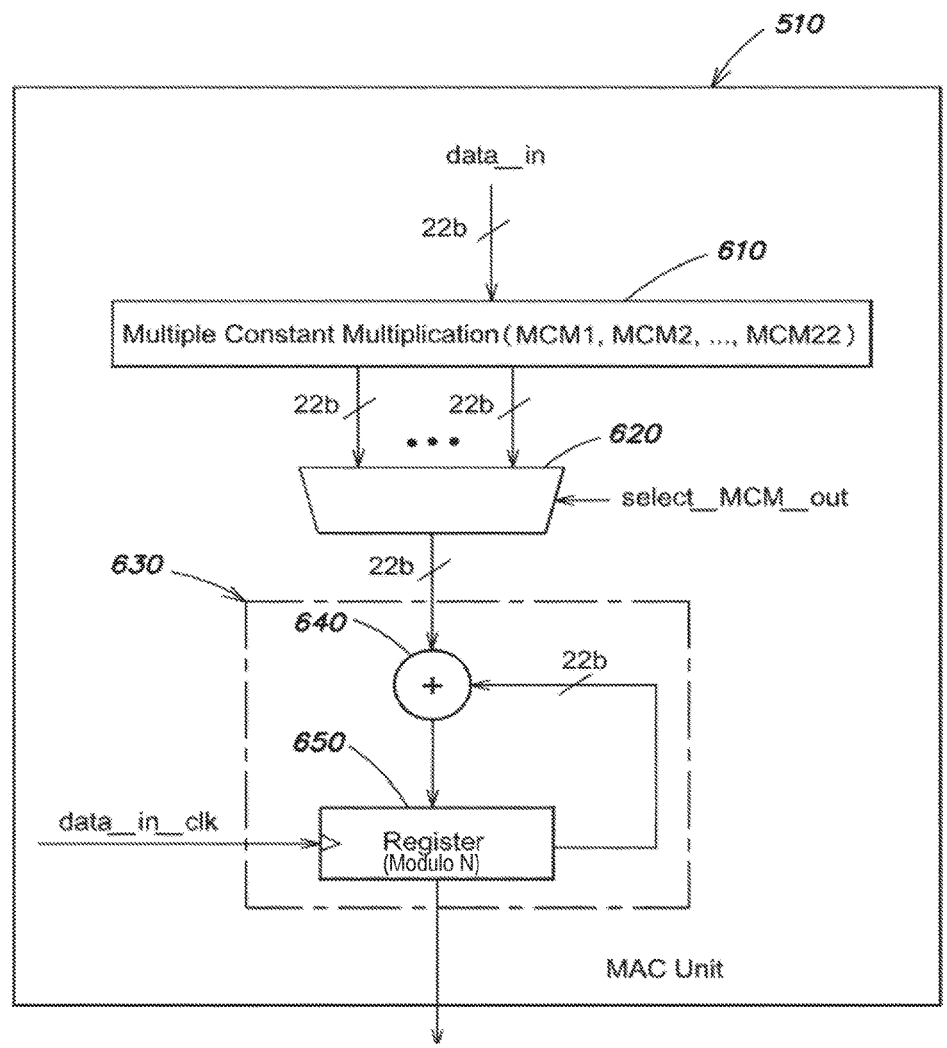
FIG. 6 is a schematic block diagram of a multiplier accumulator circuit shown in FIG. 5, in accordance with embodiments.

A schematic block diagram of a multiplier accumulator circuit 510 in accordance with embodiments is shown in FIG. 6. The MAC circuits 512, ... 520 may have the same configuration. As shown in FIG. 6, multiplier accumulator circuit 510 includes a multiple constant multiplication (MCM) circuit 610, a data selector 620 and an accumulator 630. The MCM circuit 610 receives the input data values and performs multiplication of the input data values by the small word length coefficient values. As discussed above, the coefficients can be represented in small word lengths by utilizing a differential coefficient method which corresponds to the difference between coefficients rather than the full coefficient values. The MCM circuit 610 may perform multiplication of the data values by the small word length coefficients using shift and add operations rather than multipliers. Each MCM block MCM1, MCM2, etc. shown in MCM circuit 610 can be implemented for each set of coefficients $[h_o, h_k, \ldots, h_{(M-1)k}]$, $[h_{k-1}, h_{2k-1}, \ldots, h_{Mk-1}]$, etc. respectively.

The MCM circuit 610 provides multiple outputs corresponding to the data input value multiplied by several coefficient values. The data selector 620 selects an appropriate output of the MCM circuit 610 to be provided to accumulator 630. The accumulator 630 includes a summing unit 640 and a register 650. The summing unit 640 sums the value from data selector 620 with the value contained in register 650 and stores the new value in register 650, thereby performing accumulation of the values.

Figure 7:
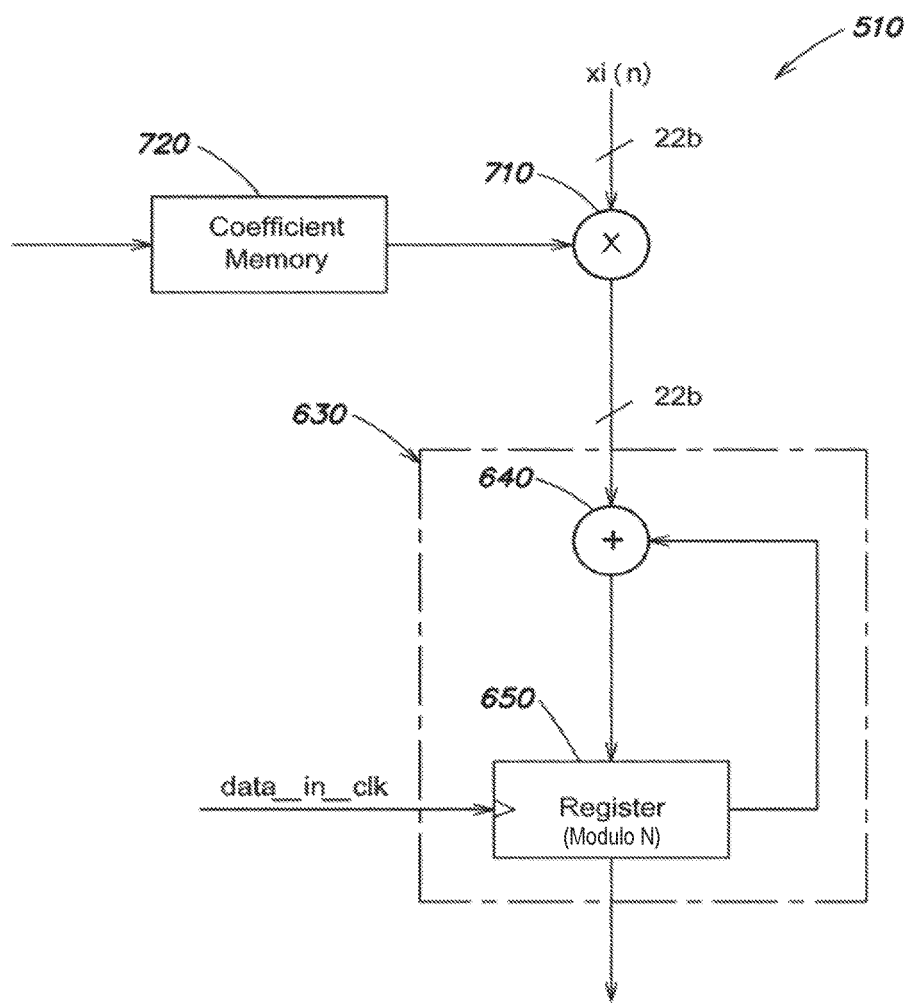
FIG. 7 is a schematic block diagram of a multiplier accumulator circuit shown in FIG. 5, in accordance with additional embodiments.

A schematic block diagram of multiplier accumulator circuit 510 in accordance with additional embodiments is shown in FIG. 7. MAC circuits 512, ... 520 may utilize the same circuit. In the embodiment of FIG. 7, the MCM circuit 610 and the data selector 620 of FIG. 6 are replaced by a multiplier 710 and a coefficient memory 720, such as a ROM (read only memory). The data input values are supplied to a first input of multiplier 710 and the coefficient values are supplied by coefficient ROM 720 to a second input of multiplier 710. The multiplier 710 multiplies the data values by the corresponding coefficient values and provides outputs to accumulator 630. The accumulator 630 accumulates the input values as discussed above. The coefficient ROM is addressed to provide sets of coefficient values as described above in connection with FIG. 5. The multiplier 710 may be relatively straightforward in view of the fact that the coefficient values from coefficient ROM may have only 2 or 3 bits.

As indicated above, the decimation factor k of the polyphase FIR filter circuit may be programmable. The decimation factor k may be programmed by operating the FIR filter circuit with different coefficient values corresponding to different decimation factors. The decimation factor may be selected by an input signal to controller 540. The controller 540 then controls the MCM circuit 610 of FIG. 6 or the coefficient memory 720 of FIG. 7 to provide the appropriate coefficient values corresponding to the selected decimation factor k.

The polyphase FIR circuit can be implemented using the implementations of the multiplier accumulator circuits described herein and using many other implementations. The polyphase FIR filter circuit can be implemented in transpose or direct form, a transpose implementation being described herein. However, the polyphase FIR filter circuit is not limited to the disclosed implementations.

Figure 8:
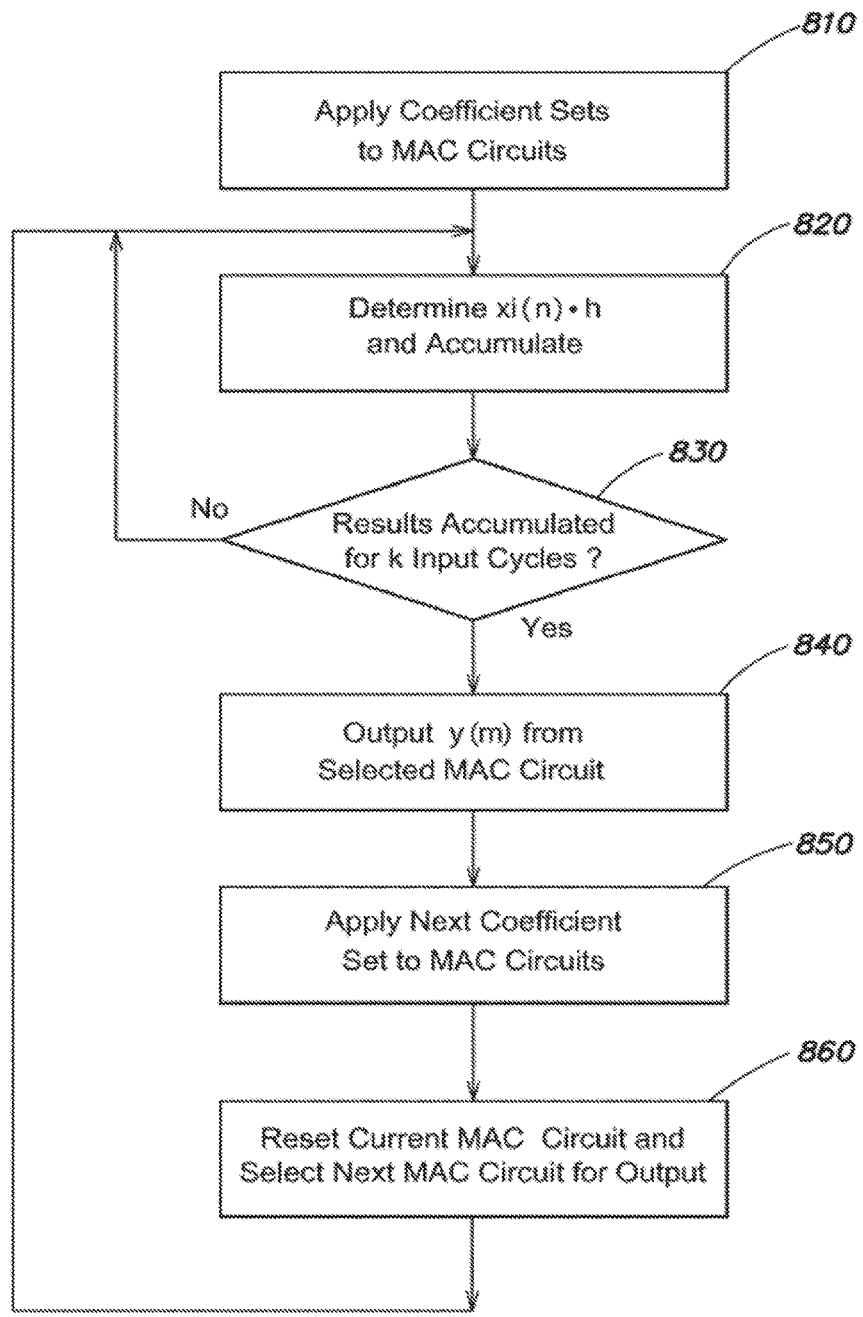
FIG. 8 is a flowchart of a process performed by the polyphase FIR filter circuit of FIG. 5, in accordance with embodiments.

A flowchart of a process performed by the polyphase FIR filter circuit of FIG. 5 in accordance with embodiments is shown in FIG. 8. The process of FIG. 8 may be controlled by the controller 540.

In act 810, coefficient sets are applied to respective MAC circuits 510, 512, ... 520. With reference to FIG. 5, the coefficient sets in the first row of coefficient sets are applied to respective MAC circuits 510, 512, ... 520. In act 820, the MAC circuits 510, 512, ... 520 multiply successive integrated input samples $x_i(n)$ by successive coefficients of the respective coefficient sets and the results are accumulated by the respective MAC circuits.

In act 830, a determination is made as to whether results have been accumulated for k input cycles. As indicated, processing for each input cycle includes multiplying the integrated input sample $x_i(n)$ by the coefficient value and accumulating the result. If it is determined in act 830 that results have not been accumulated for k input cycles, the process returns to act 820 to process the next integrated input sample.

If it is determined in act 830 that results have been accumulated for k input cycles, an output value y(m) is provided from a selected MAC circuit. In particular, the output selector 530 selects one of the MAC circuits 510, 512, . . . 520 to provide an output value.

In act 850, the controller 540 selects next coefficient sets to be applied to MAC circuits 510, 512, . . . 520. For example, the coefficient sets in the second row of FIG. 5 may be applied to the respective MAC circuits.

In act 860, the controller 540 resets the current MAC circuit which has been selected to provide an output value and then selects a next MAC circuit to provide an output value after the next k input cycles. The process then returns to act 820 and integrated input samples are multiplied by coefficient values and accumulated as described above.

A table providing synthesis results for an example filter is shown in FIG. 9. The table compares results for a conventional filter and the proposed filter. The example is a decimation FIR filter having a tap length of 308 and a decimation factor of 22. The table shows the combinational circuit area, the sequential circuit area, the overall circuit area, the total dynamic power and the critical path slack. As shown, the FIR filter described herein has a large savings in combinational area, which results in the large overall savings in area and power. When the same filter is used to implement multiple decimation ratios, the combinational logic used to implement different sets of coefficients will be huge. Therefore the percent saving in combinational area accrued by the disclosed FIR filter will far outweigh the percent increase in sequential area leading to a drastic overall saving. Although the critical path slack is not greatly affected, a timing analysis shows that the major contribution to critical path is from the MAC adder which can be easily pipelined for high frequency operation.

Figure 10:
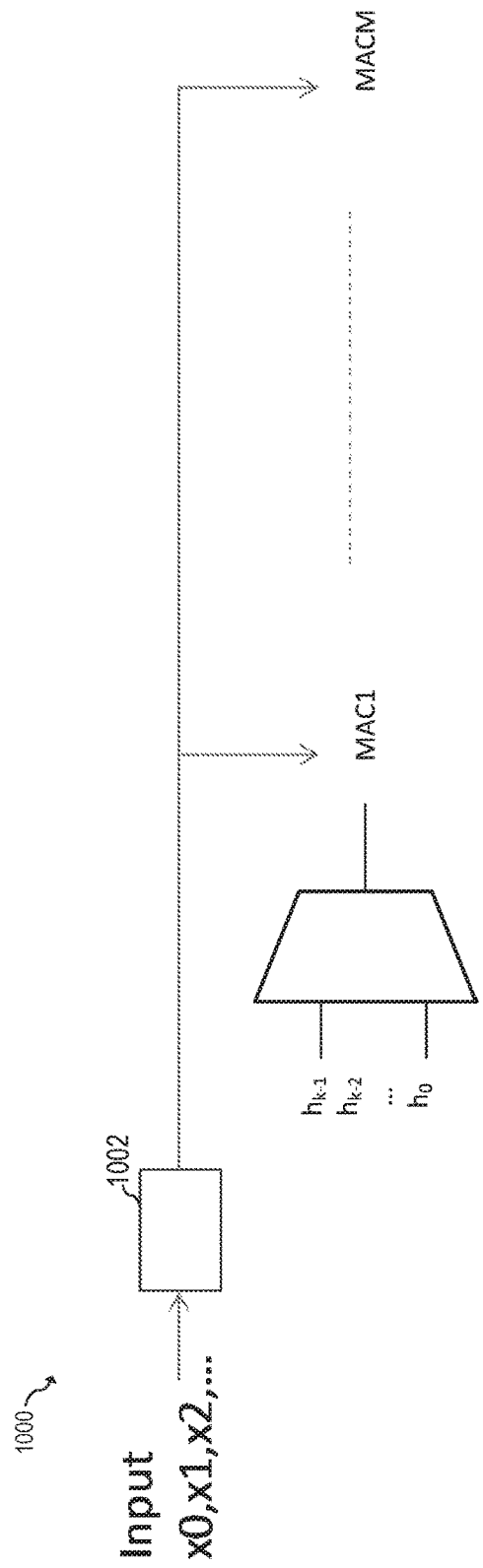
FIG. 10 shows a high-level schematic of a system using a cascaded integrator-comb (CIC) filter, in accordance with embodiments.

FIG. 10 shows a high-level schematic of DSP system 1000 using a cascaded integrator-comb (CIC) filter, in accordance with embodiments. A CIC filter, which is sometimes called a sinc filter, typically includes an integrator and a differentiator. The differentiator is implemented as an FIR filter that has a set of original coefficients. The integrator of the sinc filter may be implemented as an mth order integrator using two's complement and modulo N arithmetic, as shown by integrator 1002. The coefficients of the FIR filter of the sinc filter may be derived as an mth difference of the original filter coefficients of the FIR filter of the sinc filter. The coefficients of the FIR filter of the sinc filter may be combined with coefficients of a subsequent FIR filter cascaded with the sinc filter. System 1000 may be implemented as described, for example, in FIG. 5.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A cascaded integrator-comb (CIC) filter comprising:
   an $m^{th}$ order digital integrator configured to operate with modulo arithmetic and two's complement, the $m^{th}$ order digital integrator configured to receive input samples and to generate integrated input samples; and
   a finite impulse response (FIR) filter configured to process the integrated input samples and produce output samples with a decimation factor k, the FIR filter comprising:
   a plurality of multiplier accumulator circuits, each multiplier accumulator circuit configured to accumulate products of FIR filter coefficients and respective integrated input samples, wherein the FIR filter coefficients are derived as a difference of the $m^{th}$ order of original FIR filter coefficients, stored as the difference of the original FIR filter coefficients, and applied to respective multiplier accumulator circuits, wherein the original FIR filter coefficients have a first word length, and wherein the FIR filter coefficients have a second word length smaller than the first word length.

2. The CIC filter of claim 1, wherein the $m^{th}$ order digital integrator comprises a third order digital integrator and the FIR filter coefficients are derived as the third order difference of the original FIR filter coefficients.

3. The CIC filter of claim 1, wherein
   the FIR filter coefficients are stored in a plurality of memory banks associated with respective multiplier accumulator circuits; and
   at least some FIR filter coefficients of a memory bank are stored non-consecutively.

4. The CIC filter of claim 1, wherein the FIR filter coefficients are stored in read-only memory (ROM).

5. The CIC filter of claim 1, wherein each multiplier accumulator circuit comprises one multiple constant multiplication circuit configured to provide products of an integrated input sample and two or more FIR filter coefficients.

6. The CIC filter of claim 1, wherein the FIR filter coefficients are L bit coefficients and the original FIR filter coefficients are N bit coefficients, wherein L is a positive integer greater than zero and N is a positive integer greater than L.

7. The CIC filter of claim 1, wherein each input sample has P bits, P being a positive integer greater than zero; and each integrated input sample has Q bits, Q being a positive integer greater than P.

8. The CIC filter of claim 1, wherein the decimation factor k is programmable with a control signal.

9. A digital signal processing (DSP) system comprising:
   an $m^{th}$ order digital integrator configured to operate with modulo arithmetic and two's complement, the $m^{th}$ order digital integrator configured to receive input samples and to generate integrated input samples;
   a coefficient memory configured to store filter coefficients with a first word length, wherein the filter coefficients are derived as a difference of the $m^{th}$ order of original finite impulse response (FIR) filter coefficients having a second word length bigger than the first word length, the original FIR filter coefficients comprising filter coefficients of a sinc filter and filter coefficients of a second FIR filter; and
   a plurality of multiplier accumulator circuits configured to accumulate products of filter coefficients and respective integrated input samples, wherein respective products are generated by multiplying respective integrated input samples with filter coefficients without reconstructing the original FIR filter coefficients.

10. The DSP system of claim 9, wherein the coefficient memory comprises read-only memory (ROM).

11. The DSP system of claim 9, wherein each of the multiplier accumulator circuits comprises:

a multiple constant multiplication circuit configured to provide products of respective integrated input samples and filter coefficients; and an accumulator circuit configured to accumulate the products.

12. The DSP system of claim 9, wherein each multiplier accumulator circuit of the plurality of multiplier accumulator circuits is configured to receive a subset of the filter coefficients.

13. The DSP system of claim 12, further comprising a controller configured to change the subset of the filter coefficients supplied to the plurality of multiplier accumulator circuits after every k cycles, wherein k is a decimation factor.

14. The DSP system of claim 13, wherein the controller is further configured to:
select a multiplier accumulator circuit of the plurality of multiplier accumulator circuits to provide an output every k cycles; and
reset an accumulator of the selected multiplied accumulator circuit after the multiplied accumulator circuit provides the output.

15. A method comprising:
receiving input samples, wherein each input sample has L bits, L being a positive integer greater than zero;
integrating the input samples with a digital integrator to produce integrated input samples, wherein each integrated input sample has N bits, N being a positive integer greater than L, the digital integrator configured to operate with modulo arithmetic and two's complement; and accumulating products of the integrated input samples and filter coefficients with respective multiplier accumulator circuits, wherein the filter coefficients are derived as a difference of an $m^{th}$ order of original filter coefficients, wherein the original filter coefficients have a first word length, and wherein the filter coefficients have a second word length smaller than the first word length.

16. The method of claim 15, further comprising selecting an output of a selected multiplier accumulator circuit after every k cycles, wherein k is a decimation factor.

17. The method of claim 15, further comprising deriving the filter coefficients as the difference of the $m^{th}$ order of original filter coefficients, wherein integrating the input samples comprises $m^{th}$ order integration of the input samples.

18. The method of claim 17, wherein the original filter coefficients comprise filter coefficients of a sinc filter and filter coefficients of a second FIR filter.

19. The method of claim 17, wherein m is equal to 3.

20. The method of claim 17, further comprising:
storing the filter coefficients in a plurality of memory banks associated with respective multiplier accumulator circuits; and
at least one filter coefficients of a first memory bank of the plurality of memory banks is stored non-consecutively with other filter coefficients.

21. The method of claim 15, wherein L is equal to 6 and N is equal to 22, and k is equal to 24.

* * * * *